US008605485B2

(12) United States Patent
Kanno et al.

(10) Patent No.: US 8,605,485 B2
(45) Date of Patent: Dec. 10, 2013

(54) NON-VOLATILE SEMICONDUCTOR STORAGE DEVICE AND FORMING METHOD

(75) Inventors: Hiroshi Kanno, Mie (JP); Takafumi Shimotori, Kanagawa (JP); Yoichi Minemura, Mie (JP); Takahiko Sasaki, Tokyo (JP); Takayuki Tsukamoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 13/350,067

(22) Filed: Jan. 13, 2012

(65) Prior Publication Data

US 2012/0224411 A1    Sep. 6, 2012

(30) Foreign Application Priority Data

Mar. 2, 2011  (JP) .................................. 2011-045527

(51) Int. Cl.
*G11C 11/00* (2006.01)
(52) U.S. Cl.
USPC ...................................... 365/148; 365/185.24
(58) Field of Classification Search
USPC .......................................... 365/148, 185.24
See application file for complete search history.

(56) References Cited

U.S. PATENT DOCUMENTS

| 7,126,843 | B2 | 10/2006 | Higashi |
| 2010/0027308 | A1 | 2/2010 | Maejima |
| 2010/0208510 | A1 | 8/2010 | Hosono et al. |
| 2010/0214820 | A1* | 8/2010 | Hosono et al. ............... 365/148 |
| 2010/0232208 | A1* | 9/2010 | Maejima et al. ............. 365/148 |
| 2010/0238702 | A1* | 9/2010 | Yamaguchi et al. ......... 365/148 |
| 2011/0019492 | A1* | 1/2011 | Kawaguchi et al. ......... 365/201 |
| 2011/0051498 | A1* | 3/2011 | Shimotori .................... 365/148 |
| 2011/0116300 | A1* | 5/2011 | Maejima ...................... 365/148 |
| 2011/0235400 | A1 | 9/2011 | Shimotori et al. |

FOREIGN PATENT DOCUMENTS

| JP | 2003-242771 | 8/2003 |
| JP | 2010-33675 | 2/2010 |
| JP | 2010-192040 | 9/2010 |
| JP | 2010-218615 A | 9/2010 |
| WO | WO 2007/141865 A1 | 12/2007 |

OTHER PUBLICATIONS

Japanese Office Action Issued Jun. 4, 2013 in Patent Application No. 2011-045527 (with English translation).
Office Action mailed Aug. 20, 2013 in Japanese Application No. 2011-045527 filed Mar. 2, 2011 (w/English translation).

* cited by examiner

*Primary Examiner* — Michael Tran
(74) *Attorney, Agent, or Firm* — Oblon, Spivak, McClelland, Maier & Neustadt, L.L.P.

(57) ABSTRACT

According to one embodiment, a control unit multiple-selects a first line for every N lines from a plurality of first lines. N is an integer greater than or equal to one. The control unit sets the multiple-selected first lines to a selection potential, and fixes potentials of non-selected first lines at least adjacent to the multiple-selected first lines at a first timing. The control unit causes the multiple-selected first lines to be in a floating state at a second timing after the first timing. The control unit selects one second line from the plurality of second lines and sets the one second line to a forming potential at a third timing after the second timing.

34 Claims, 6 Drawing Sheets

US 8,605,485 B2

NON-VOLATILE SEMICONDUCTOR STORAGE DEVICE AND FORMING METHOD

CROSS-REFERENCE TO RELATED APPLICATIONS

This application is based upon and claims the benefit of priority from Japanese Patent Application No. 2011-045527, filed on Mar. 2, 2011; the entire contents of which are incorporated herein by reference.

FIELD

Embodiments described herein relate generally to a non-volatile semiconductor storage device and a forming method.

BACKGROUND

A variable resistor element is an element capable of electrically switching at least two resistance values such as a high resistance state and a low resistance state. Since the variable resistor element is generally configured from an insulating material, an initial step (hereinafter referred to as forming) of forming a conductive path in the variable resistor element is required to enable the resistance state to be electrically switched. Specifically, the forming is carried out by applying a voltage between an upper electrode (bit line) and a lower electrode (word line) of a selected variable resistor element. Although only the current of about 10 nA is flowed even if the forming voltage (e.g., 5V) is applied since the variable resistor element before forming is in an insulating state, the variable resistor element becomes lower resistance and the current of a few µA is flowed when forming is carried out. When made to lower resistance, the variable resistor element is able to reset (higher resistance state) or set (lower resistance state), so that data can be stored. The forming process is difficult to carry out on a plurality of bits (a plurality of variable resistor elements) collectively, and thus the process tends to take time.

DETAILED DESCRIPTION

In general, according to one embodiment, there is provided a non-volatile semiconductor storage device including a plurality of first lines, a plurality of second lines, a plurality of non-volatile memory cells, and a control unit. The plurality of second lines intersect the plurality of first lines. The plurality of non-volatile memory cells are arranged at positions where the plurality of first lines and the plurality of second lines intersect. The control unit controls the plurality of non-volatile memory cells through the plurality of first lines and the plurality of second lines. A variable resistor element and a rectifier element are connected in series in each of the plurality of non-volatile memory cells. The control unit multiple-selects a first line for every N lines from the plurality of first lines. N is an integer greater than or equal to one. The control unit sets the multiple-selected first lines to a selection potential, and fixes potentials of non-selected first lines at least adjacent to the multiple-selected first lines at a first timing. The control unit causes the multiple-selected first lines to be in a floating state at a second timing after the first timing. The control unit selects one second line from the plurality of second lines and sets the one second line to a forming potential at a third timing after the second timing.

Exemplary embodiments of a non-volatile semiconductor storage device and a forming method will be explained below in detail with reference to the accompanying drawings. The present invention is not limited to the following embodiments.

First Embodiment

Figure 1:
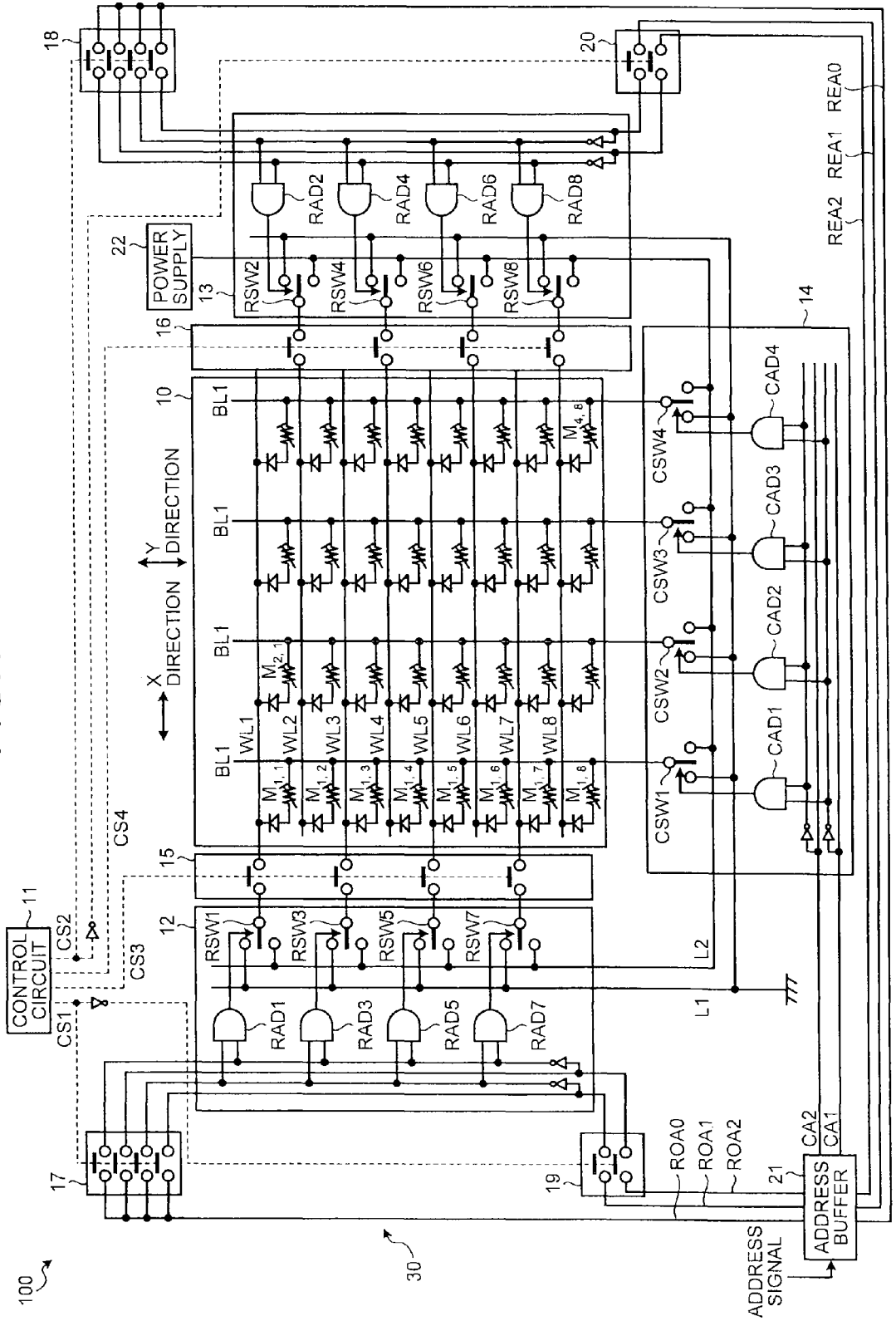
FIG. 1 is a view illustrating a configuration of a non-volatile semiconductor storage device according to a first embodiment.

A configuration of a non-volatile semiconductor storage device 100 according to a first embodiment will be described using FIG. 1. FIG. 1 is an equivalent circuit diagram of a non-volatile semiconductor storage device according to a first embodiment.

As illustrated in FIG. 1, the non-volatile semiconductor storage device 100 includes a memory cell array 10 and a peripheral circuit (control unit) 30. The memory cell array 10 stores data. The peripheral circuit 30 controls the memory cell array 10.

The memory cell array 10 includes a plurality of word lines WL (WL1 to WL8), a plurality of bit lines BL (BL1 to BL4), and a plurality of non-volatile memory cells ($M_{1,1}$ to $M_{4,8}$).

The plurality of words lines WL (WL1 to WL8) intersect the plurality of bit lines BL. Each word line WL is arrayed with a predetermined pitch in a Y direction, and is formed to extend in an X direction (row direction). In FIG. 1, a case where eight word lines WL are arranged is shown, but the number of word lines WL is not limited to that illustrated in FIG. 1.

The plurality of bits lines BL (BL1 to BL4) intersect the plurality of word lines WL. Each bit line BL is arrayed with a predetermined pitch in the X direction, and is formed to extend in the Y direction (column direction). In FIG. 1, a case where four bit lines BL are arranged is shown, but the number of bit lines BL is not limited to that illustrated in FIG. 1.

The plurality of non-volatile memory cells M ($M_{1,1}$ to $M_{4,8}$) are arranged at positions where the plurality of word lines WL and the plurality of bit lines BL intersect. The plurality of non-volatile memory cells M are arrayed in a matrix form on a plane formed by the X direction and the Y direction. In other words, the non-volatile semiconductor storage device 100 is a so-called cross point type resistance change memory. A case where the non-volatile memory cell M is arrayed in 4 rows×8 columns is shown in FIG. 1, but the array of the non-volatile memory cells M is not limited to that illustrated in FIG. 1.

Figure 2:
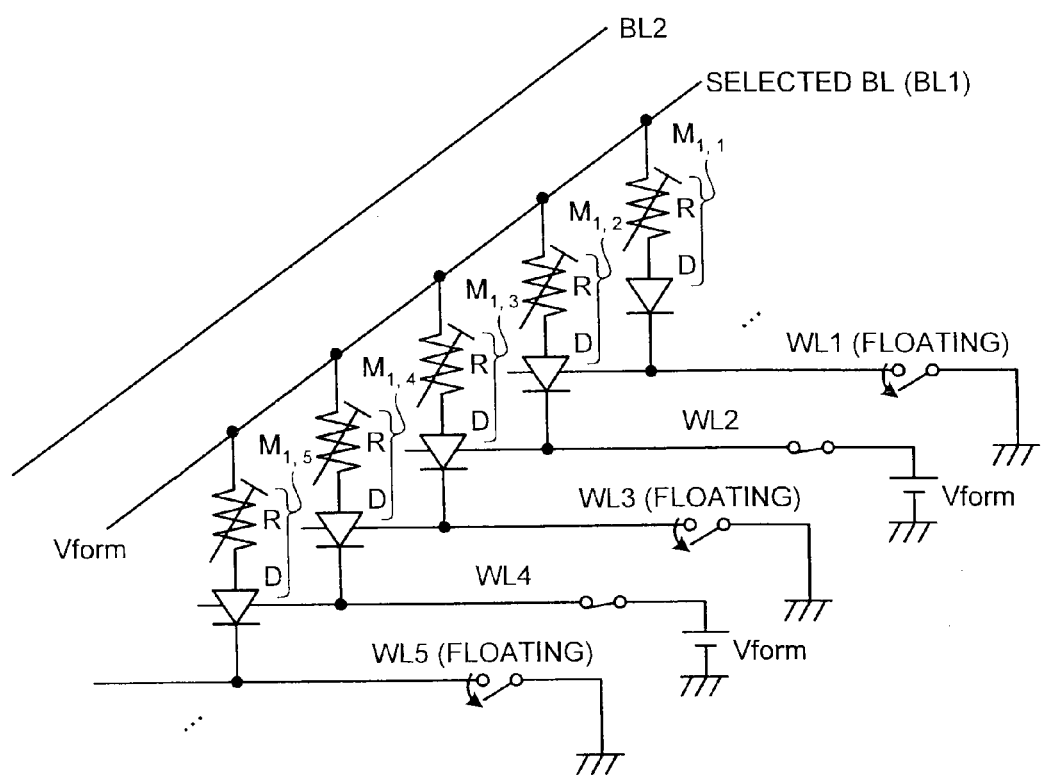
FIG. 2 is a view describing a forming operation in the first embodiment.

In each non-volatile memory cell M, a variable resistor element R and a diode (rectifier element) D are connected in series (see FIG. 2). The variable resistor element R is electrically rewritable, and stores data in a non-volatile manner based on a resistance value. The diode D is arranged to electrically access (forming/write/erase/read) a selected cell, and is also arranged to prevent a sneak current at the time of access. One end of the variable resistor element R is connected to the bit line (BL) and the other end of the variable resistor element R is connected to one end of the diode D. The other end of the diode D is connected to the word line (WL).

The variable resistor element R is an element that transitions between states of at least two resistance values, for example, between states of two resistance values of a low resistance state and a high resistance state. The variable resistor element R transitions from the high resistance state to the low resistance state when a certain set voltage is applied on both ends of the non-volatile memory cell M such that the diode D is in a forward direction (write, set). The variable resistor element R transitions from the low resistance state to the high resistance state when a certain reset voltage is applied on both ends of the non-volatile memory cell M such that the diode D is in a forward direction (erase, reset). However, a step called forming is required to obtain a state where the set operation and the reset operation can be carried out, that is, a state where the resistance value can be electrically controlled since the variable resistor element R is generally formed from an insulating material. The forming is carried out by applying a voltage pulse having a predetermined magnitude and a time width on the variable resistor element R.

In FIG. 1, a case where the direction from the bit line BL towards the word line WL through the non-volatile memory cell M is the forward direction of the diode D in each non-volatile memory cell M is illustrated, but the direction from the bit line BL towards the word line WL through the non-volatile memory cell M may be a reverse direction of the diode D. Furthermore, a case where the resistance change element R is arranged on the bit line BL side and the diode D is arranged on the word line WL side in each non-volatile memory cell M is illustrated in FIG. 1, but the diode D may be arranged on the bit line BL side and the resistance change element R may be arranged on the word line WL side.

Moreover, a case where each non-volatile memory cell M is a unipolar memory cell is illustrated in FIG. 1, but each non-volatile memory cell M may be a bipolar memory cell. In this case, the resistance change element and a bidirectional diode may be connected in series in each non-volatile memory cell M.

As illustrated in FIG. 1, the peripheral circuit 30 includes a control circuit 11, a first row decoder circuit (first selection circuit) 12, a second row decoder circuit (first selection circuit) 13, a column decoder (second selection circuit) 14, a first word line connection circuit 15, a second word line connection circuit 16, an all first word line selection circuit (first selection circuit) 17, an all second word line selection circuit 18, a first word line selection circuit (first selection circuit) 19, a second word line selection circuit (first selection circuit) 20, and an address buffer circuit 21.

The address buffer circuit 21 receives an input of an address signal of the word line WL or the bit line BL to be selected at the time of forming/read/write/erase. For instance, the address buffer circuit 21 provides an address signal ROA0 to the all first word line selection circuit 17, provides address signals ROA1, ROA2 to the first word line selection circuit 19, provides an address signal REA0 to the all second word line selection circuit 18, and provides address signals REA1, REA2 to the second word line selection circuit 20, as an address signal of the word line WL to be selected. Alternatively, the address buffer circuit 21 provides address signals CA1, CA2 to a column decoder 14 as an address signal of the bit line BL to be selected.

If a control signal CS1 from the control circuit 11 is "High", the all first word line selection circuit 17 transfers the address signal ROA0 to the first row decoder circuit 12. The first row decoder circuit 12 collectively causes the odd-numbered word lines WL1, WL3, WL5, WL7 to be in a selected state (i.e., multiple-selection) when the ROA0 is "High", and collectively causes the odd-numbered word lines WL1, WL3, WL5, WL7 to be in a non-selected state when the ROA0 is "Low".

If the control signal CS1 from the control circuit 11 is "Low", the first word line selection circuit 19 transfers the address signals ROA1, ROA2 to the first row decoder circuit 12. The first row decoder circuit 12 selects one of the odd-numbered word lines WL1/WL3/WL5/WL7 based on the address signals ROA1, ROA2.

The first row decoder circuit 12 includes switch circuits RSW1, RSW3, RSW5, RSW7, AND circuits RAD1, RAD3, RAD5, RAD7, and wirings L1, L2. The wiring L1 is connected to a ground voltage GND. The wiring L2 is connected to a power supply 22. The first row decoder circuit 12 drives the corresponding switch circuit RSW1, RSW3, RSW5, RSW7 according to the combination of "High", "Low" of the input signal of each AND circuit RAD1, RAD3, RAD5, RAD7, and connects the odd-numbered word line to the wiring L1 or the wiring L2.

If a control signal CS2 from the control circuit 11 is "High", the all second word line selection circuit 18 transfers the address signal REA0 to the second row decoder circuit 13. The second row decoder circuit 13 collectively causes the even-numbered word lines WL2, WL4, WL6, WL8 to be in a selected state (i.e., multiple-selection) when the REA0 is "High", and collectively causes the even-numbered word lines WL2, WL4, WL6, WL8 to be in a non-selected state when the REA0 is "Low".

If the control signal CS2 from the control circuit 10 is "Low", the second word line selection circuit 20 transfers the address signals REA1, REA2 to the second row decoder circuit 13. The second row decoder circuit 13 selects one of the even-numbered word lines WL2/WL4/WL6/WL8 based on the address signals REA1, REA2.

The second row decoder circuit 13 includes switch circuits RSW2, RSW4, RSW6, RSW8, AND circuits RAD2, RAD4, RAD6, RAD8, and wirings L1, L2. The wiring L1 is connected to the ground voltage GND. The wiring L2 is connected to the power supply 22. The second row decoder circuit 13 drives the corresponding switch circuit RSW2, RSW4, RSW6, RSW8 according to the combination of "High", "Low" of the input signal of each AND circuit RAD2, RAD4, RAD6, RAD8, and connects the even-numbered word line to the wiring L1 or the wiring L2.

The column decoder 14 selects one of the bit lines BL1 to BL4 based on the address signals CA1, CA2.

The column decoder 14 includes switch circuits CSW1 to CSW4, AND circuits CAD1 to CAD4, and wirings L1, L2. The wiring L1 is connected to the ground voltage GND. The wiring L2 is connected to the power supply 22. The column decoder 14 drives the corresponding switch circuit CSW1 to CSW4 according to the combination of "High", "Low" of the input signal of each AND circuit CAD1 to CAD4, and connects the even-numbered word line to the wiring L1 or the wiring L2.

The first word line connection circuit 15 collectively switches the state of connection/non-connection of the odd-numbered word line WL1, WL3, WL5, WL7 to the first row decoder circuit 12 based on a control signal CS3 from the control circuit 11. The second word line connection circuit 16 collectively switches the state of connection/non-connection of the even-numbered word line WL2, WL4, WL6, WL8 to the second row decoder circuit 13 based on a control signal CS4 from the control circuit 11.

The control circuit 11 outputs the control signals CS1 to CS4, connects the power supply 22 or the ground voltage GND to each bit line BL and each word line WL according to the timing chart set in advance at the time of forming/read/write/erase.

The forming operation of the non-volatile memory cell M in the non-volatile semiconductor storage device 100 will now be described using FIG. 2 and FIG. 3. FIG. 2 is a schematic diagram describing the forming operation of the non-volatile memory cell M, and FIG. 3 is a timing chart illustrating the basic flow of the forming operation.

Figure 3:
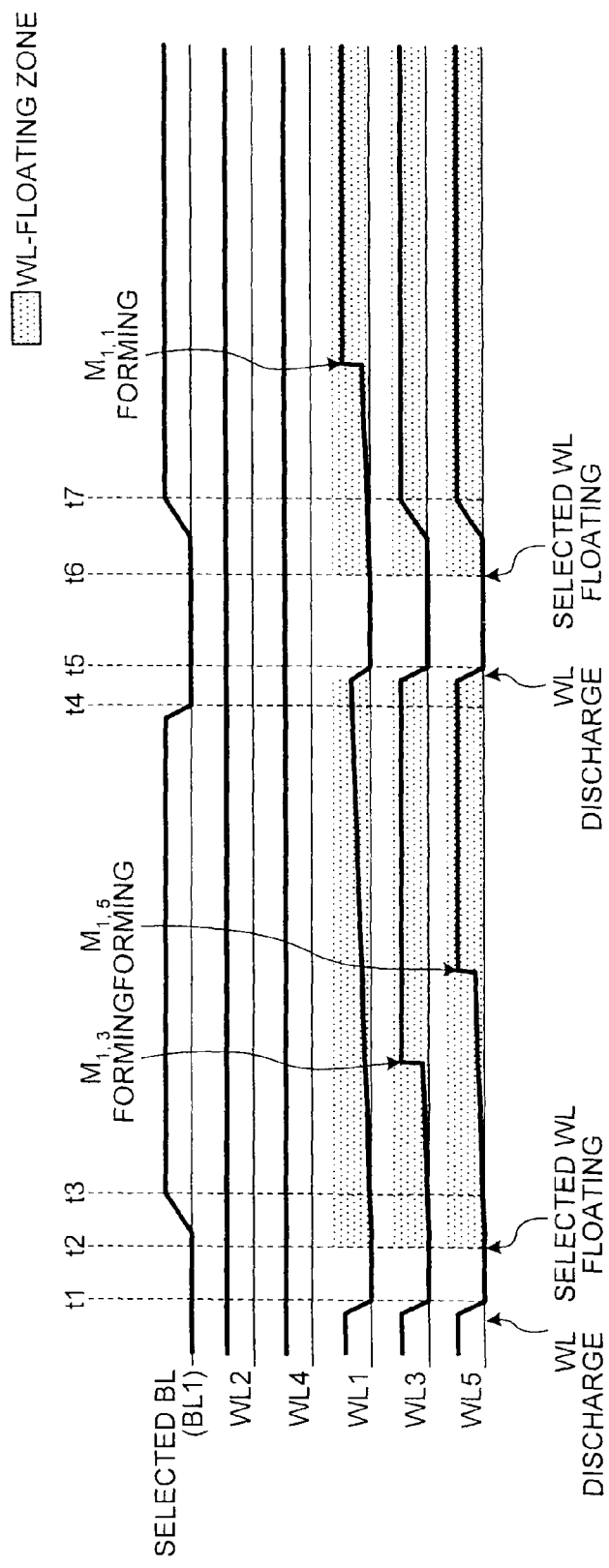
FIG. 3 is a timing chart illustrating the forming operation in the first embodiment.

In FIG. 2 and FIG. 3, the plurality of word lines WL1 to WL5, the plurality of bit lines BL1, BL2, and the plurality of non-volatile memory cells $M_{1,1}$ to $M_{1,5}$ of the configuration of the memory cell array 10 illustrated in FIG. 1 will be described by way of example.

As illustrated in FIG. 2, the peripheral circuit 30 multiple-selects the word lines WL1, WL3, WL5 alternately from the plurality of word lines WL1 to WL5 and sets the same to a selection potential (e.g., potential of GND level), and sets the non-selected word lines WL2, WL4 to a non-selection potential (e.g., forming potential Vform). Thereafter, the peripheral circuit 30 shields the multiple-selected word lines WL1, WL3, WL5 from the selection potential to have then in a floating state, and causes the potential of the non-selected word lines WL2, WL4, adjacent to the multiple-selected word lines WL1, WL3, WL5, to be remained fixed at the non-selection potential. The peripheral circuit 30 selects one bit line BL1 from the plurality of bit lines BL1, BL2 and sets the same to the forming potential Vform. The non-volatile memory cells $M_{1,1}$, $M_{1,3}$, $M_{1,5}$ the can be simultaneously formed. In other words, the non-volatile memory cells $M_{1,1}$, $M_{1,3}$, $M_{1,5}$ are multiple-selected and formed. In this case, the non-volatile memory cells $M_{1,2}$, $M_{1,4}$ are non-selected memory cells.

Specifically, as illustrated in FIG. 3, at timing t1, the first row decoder circuit 12 multiple-selects the word lines WL1, WL3, WL5 alternately from the plurality of word lines WL1 to WL5. The control circuit 11 connects the multiple-selected word lines WL1, WL3, WL5 and the first row decoder circuit 12 through the first word line connection circuit 15. The multiple-selected word lines WL1, WL3, WL5 are thereby set to the selection potential (e.g., potential of GND level).

The second row decoder circuit 13, on the other hand, non-selects the word lines WL2, WL4 from the plurality of word lines WL1 to WL5. The control circuit 11 connects the non-selected word lines WL2, WL4 and the second row decoder circuit 13 through the second word line connection circuit 16. The non-selected word lines WL2, WL4 are thereby set to the non-selection potential (e.g., potential of forming potential Vform).

At timing t2, the control circuit 11 disconnects the multiple-selected word lines WL1, WL3, WL5 and the first row decoder circuit 12 through the first word line connection circuit 15. The multiple-selected word lines WL1, WL3, WL5 are thereby in a floating state.

The control circuit 11 continues to connect the non-selected word lines WL2, WL4 and the second row decoder circuit 13 through the second word line connection circuit 16. The non-selected word lines WL2, WL4 are thereby fixed to the non-selection potential (e.g., forming potential Vform).

At timing t3, the column decoder 14 selects one bit line BL1 from the plurality of bit lines BL1, BL2 and sets the same to the forming potential Vform. The non-volatile memory cells $M_{1,1}$, $M_{1,3}$, $M_{1,5}$ are thereby multiple-selected and the forming voltage Vform is applied to both ends thereof. In this case, the non-volatile memory cells $M_{1,2}$, $M_{1,4}$ are in a non-selected state, and voltage is barely applied to both ends thereof.

As the variable resistor element before forming is in an insulating state, the current flowing to the memory cell is very small or about 10 nA even with the forming voltage Vform applied, and hence the charging of the selected word lines WL1, WL3, WL5 gradually advances and the Vform is continuously applied on the selected memory cell within a constant time.

When the non-volatile memory cell $M_{1,3}$ foams at a certain time point, the word line WL3 is charged up to the forming potential Vform through the non-volatile memory cell $M_{1,3}$, and thus the selected bit line BL and the word line WL3 become the same potential, the voltage is not applied on the non-volatile memory cell $M_{1,3}$ thereafter. That is, the voltage application on the formed non-volatile memory cell is automatically stopped. As the potentials of the word lines WL2, WL4 adjacent to both sides are fixed at the forming potential Vform even if the word line WL3 is charged to the forming potential Vform, the potentials of the word line WL1 and the word line WL5 are suppressed from rising by coupling.

A state in which the non-volatile memory cell $M_{1,5}$ is formed following the non-volatile memory cell $M_{1,3}$, and the potential of the word line WL5 is rapidly charged to the forming potential Vform is illustrated in FIG. 3.

Subsequently, the potential of the word line WL1 does not rapidly change since the non-volatile memory cell $M_{1,1}$ is not yet formed, but a state of being gradually charged by the current of about 10 nA before forming is illustrated in FIG. 3. When the potential of the word line WL1 gradually rises, the voltage applied on the non-volatile memory cell $M_{1,1}$ lowers and the probability of the non-volatile memory cell $M_{1,1}$ to form lowers.

Thus, at timing t4, in which a constant time is elapsed from timing t3, the column decoder 14 sets the potential of the selected bit line BL1 to the non-selection potential (e.g., GND potential).

At the subsequent timing t5, the control circuit 11 again connects the multiple-selected word lines WL1, WL3, WL5 and the first row decoder circuit 12 through the first word line connection circuit 15. The multiple-selected word lines WL1, WL3, WL5 are thereby discharged to the selection potential (e.g., potential of GND level) and refreshed. In this case, the non-selected word lines WL2, WL4 remain set at the non-selection potential (e.g., forming potential Vform).

At timing t6, the control circuit 11 disconnects the multiple-selected word lines WL1, WL3, WL5 and the first row decoder circuit 12 through the first word line connection circuit 15. The multiple-selected word lines WL1, WL3, WL5 are thereby again in the floating state. In this case, the non-selected word lines WL2, WL4 are fixed to the non-selection potential (e.g., forming potential Vform).

At timing t7, the column decoder 14 selects one bit line BL1 from the plurality of bit lines BL1, BL2, and sets the same to the forming potential Vform. The non-volatile memory cells $M_{1,1}$, $M_{1,3}$, $M_{1,5}$ are thereby multiple-selected and the forming voltage Vform is applied to both ends thereof. In this case, the non-volatile memory cells $M_{1,2}$, $M_{1,4}$ are in a non-selected state and the voltage is barely applied to both ends thereof.

In this case, the word lines WL3, WL5 to which the formed non-volatile memory cells $M_{1,3}$, $M_{1,5}$ are connected are rapidly charged with the potential rise of the selected bit line BL1 to the forming potential Vform, and thus the forming voltage is not applied to both ends of the non-volatile memory cells $M_{1,3}$, $M_{1,5}$ and the forming voltage is efficiently applied to both ends of the non-volatile memory cell $M_{1,1}$ not yet formed.

According to the above procedure, about half the number of bits of the plurality of non-volatile memory cells $M_{1,1}$ to $M_{1,5}$ connected to the selected bit line BL1 can be collectively (continuously) formed.

The verify operation may be carried out in the period of timing t5 to t6, and the formed non-volatile memory cells $M_{1,3}$, $M_{1,5}$ of the multiple-selected non-volatile memory cells $M_{1,1}$, $M_{1,3}$, $M_{1,5}$ may be specified.

Figure 4:
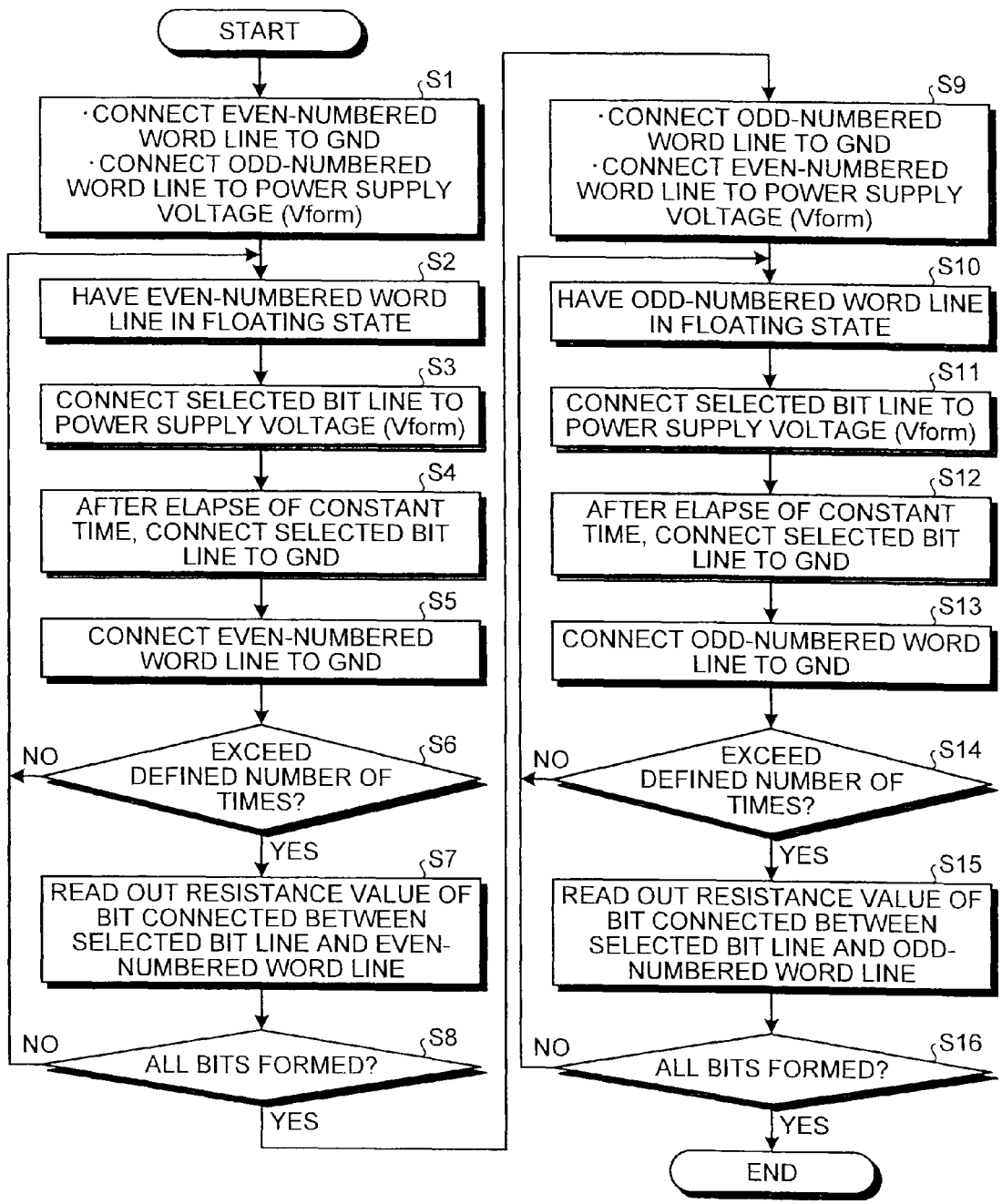
FIG. 4 is a flowchart illustrating the forming operation in the first embodiment.

The flow of processes in the forming operation will now be described using FIG. 4. FIG. 4 is a flowchart illustrating the flow of processes in the forming operation. As illustrated in FIG. 4, the forming operation is carried out mainly in two stages, the forming (steps S1 to S8) of bits connected to the even-numbered word lines and the forming (steps S9 to S16) of bits connected to the odd-numbered word lines. The odd-numbered word line may be first or the even-numbered word line may be first in the order of forming. In the following, a case of carrying out the forming of bits connected to the even-numbered word line first will be described.

In step S1, the second row decoder circuit 13 multiple-selects the even-numbered word lines WL2, WL4, WL6, WL8 from the plurality of word lines WL1 to WL8. The control circuit 11 connects the multiple-selected word lines WL2, WL4, WL6, WL8 and the second row decoder circuit 13 through the second word line connection circuit 16. The multiple-selected word lines WL2, WL4, WL6, WL8 are thereby set to the selection potential (e.g., potential of GND level).

The first row decoder circuit 12 non-selects the odd-numbered word lines WL1, WL3, WL5, WL7 from the plurality of word lines WL1 to WL8. The control circuit 11 connects the non-selected word lines WL1, WL3, WL5, WL7 and the first row decoder circuit 12 through the first word line connection circuit 15. The non-selected word lines WL1, WL3, WL5, WL7 are thereby set to the selection potential (e.g., forming potential Vform).

In step S2, the control circuit 11 disconnects the multiple-selected word lines WL2, WL4, WL6, WL8 and the second row decoder circuit 13 through the second word line connection circuit 16. The multiple-selected word lines WL2, WL4, WL6, WL8 are thereby in a floating state.

The control circuit 11 continues to connect the non-selected word lines WL1, WL3, WL5, WL7 and the first row decoder circuit 12 through the first word line connection circuit 15. The non-selected word lines WL1, WL3, WL5, WL7 are thereby fixed to the non-selection potential (e.g., forming potential Vform).

In step S3, the column decoder 14 selects one bit line BL (e.g., bit line BL1) from the plurality of bit lines BL1 to BL4 and sets the same to the forming potential Vform. The non-volatile memory cells $M_{1,2}$, $M_{1,4}$, $M_{1,6}$, $M_{1,8}$ are thereby multiple-selected and the forming voltage Vform is applied on both ends thereof.

In step S4, after a constant time has elapsed, the column decoder 14 sets the potential of the selected bit line BL1 to the non-selection potential (e.g., GND potential).

In step S5, the control circuit 11 again connects the multiple-selected word lines WL2, WL4, WL6, WL8 and the second row decoder circuit 13 through the second word line connection circuit 16. The multiple-selected word lines WL2, WL4, WL6, WL8 are thereby discharged to the selection potential (e.g., potential of GND level) and refreshed. In this case, the non-selected word lines WL1, WL3, WL5, WL7 are remained set to the non-selection potential (e.g., forming potential Vform).

In step S6, the control circuit 11 determines whether or not the number of times of the forming processes exceeded the defined number of times. The control circuit 11 proceeds the process to step S7 if the number of times of the forming process exceeded the defined number of times, and returns the process to step S2 if the number of times of the forming process does not exceed the defined number of times.

In step S7, the control circuit 11 reads out the bits connected between the selected bit line BL1 and the even-numbered word lines WL2, WL4, WL6, WL8, that is, the resistance values of the multiple-selected non-volatile memory cells $M_{1,2}$, $M_{1,4}$, $M_{1,8}$, $M_{1,8}$ through the column decoder 14.

In step S8, the control circuit 11 carries out the verify operation on whether or not the forming of all bits of the multiple-selected non-volatile memory cells $M_{1,2}$, $M_{1,4}$, $M_{1,6}$, $M_{1,8}$ is completed. The control circuit 11 proceeds the process to step S9 if the forming of all bits is completed, and returns the process to step S2 if there is a bit in which the forming is not completed.

In step S9, the first row decoder circuit 12 multiple-selects the odd-numbered word lines WL1, WL3, WL5, WL7 from the plurality of word lines WL1 to WL8. The control circuit 11 connects the multiple-selected word lines WL1, WL3, WL5, WL7 and the first row decoder circuit 12 through the first word line connection circuit 15. The multiple-selected word lines WL1, WL3, WL5, WL7 are thereby set to the selection potential (e.g., potential of GND level).

The second row decoder circuit 13 non-selects the even-numbered word lines WL2, WL4, WL6, WL8 of the plurality of word lines WL1 to WL8. The control circuit 11 connects the non-selected word lines WL2, WL4, WL6, WL8 and the second row decoder circuit 13 through the second word line connection circuit 16. The non-selected word lines WL2, WL4, WL6, WL8 are thereby set to the non-selection potential (e.g., forming potential Vform).

In step S10, the control circuit 11 disconnects the multiple-selected word lines WL1, WL3, WL5, WL7 and the first row decoder circuit 12 through the first word line connection circuit 15. The multiple-selected word lines WL1, WL3, WL5, WL7 are thereby in a floating state.

The control circuit 11 continues to connect the non-selected word lines WL2, WL4, WL6, WL8 and the second row decoder circuit 13 through the second word line connection circuit 16. The non-selected word lines WL2, WL4, WL6, WL8 are thereby fixed to the non-selection potential (e.g., forming potential Vform).

In step S11, the column decoder 14 selects one bit line BL (e.g., bit line BL1) from the plurality of bit lines BL1 to BL4 and sets the same to the forming potential Vform. The non-volatile memory cells $M_{1,1}$, $M_{1,3}$, $N_{1,5}$, $M_{1,7}$ are thereby multiple-selected and the forming voltage Vform is applied to both ends thereof.

In step S12, after a constant time has elapsed, the column decoder 14 sets the potential of the selected bit line BL1 to the non-selection potential (e.g., GND potential).

In step S13, the control circuit 11 again connects the multiple-selected word lines WL1, WL3, WL5, WL7 and the first row decoder circuit 12 through the first word line connection circuit 15. The multiple-selected word lines WL1, WL3, WL5, WL7 are thereby discharged to the selection potential (e.g., potential of GND level) and refreshed. In this case, the non-selected word lines WL2, WL4, WL6, WL8 are remained set to the non-selection potential (e.g., forming potential Vform).

In step S14, the control circuit 11 determines whether or not the number of times of the forming processes exceeds the defined number of times. The control circuit 11 proceeds the process to step S15 if the number of times of the forming process exceeds the defined number of times, and returns the process to step S10 if the number of times of the forming process does not exceed the defined number of times.

In step S15, the control circuit 11 reads out the bits connected between the selected bit line BL1 and the odd-numbered word lines WL1, WL3, WL5, WL7, that is, the resistance values of the multiple-selected non-volatile memory cells $M_{1,1}$, $M_{1,3}$, $M_{1,5}$, $M_{1,7}$ through the column decoder 14.

In step S16, the control circuit 11 carries out the verify operation on whether or not the forming of all bits of the multiple-selected non-volatile memory cells $M_{1,1}$, $M_{1,3}$, $M_{1,5}$, $M_{1,7}$ is completed. The control circuit 11 proceeds the process to the next step (not illustrated) if the forming of all bits is completed, and returns the process to step S10 if there is a bit in which the forming is not completed.

The processes S1 to S6 are similarly carried out for when the other bit lines BL2 to BL4 are selected. Half of the non-volatile memory cells, for example, connected to each bit line thus can be collectively formed.

Consider a case where the peripheral circuit 30 multiple-selects the even-numbered word lines WL2, WL4, WL6, WL8 and sets the same to the selection potential (e.g., GND potential), and then sets the selected bit line BL1, for example, to the forming potential Vform without having the multiple-selected word lines WL2, WL4, WL6, WL8 in a floating state. In this case, when one of the non-volatile memory cells of the multiple-selected non-volatile memory cells $M_{1,2}$, $M_{1,4}$, $M_{1,6}$, $M_{1,8}$ is formed, a current of a few μA flows to the common upper electrode (bit line) through the relevant non-volatile memory cells thus causing a voltage drop between the bit line driver and the non-volatile memory cell and a desired voltage may not be applied to other non-volatile memory cells that are not formed.

In the first embodiment, on the other hand, the peripheral circuit 30 multiple-selects the even-numbered word lines WL2, WL4, WL6, WL8 and sets the same to the selection potential (e.g., GND potential), and then causes the multiple-selected word lines WL2, WL4, WL6, WL8 to be in a floating state and sets the bit line BL1 selected in such state to the forming potential Vform. The multiple-selected non-volatile memory cells $M_{1,2}$, $M_{1,4}$, $M_{1,8}$, $M_{1,8}$ thus can be collectively (continuously) formed, and the time required for the forming step can be greatly reduced.

Specifically, at timing t1, the control circuit 11 connects the multiple-selected word lines and the first row decoder circuit 12 by the first word line connection circuit 15 and sets the multiple-selected word lines to the selection potential (e.g., GND potential). At timing t2, the control circuit 11 disconnects the multiple-selected word lines and the first row decoder circuit 12 by the first word line connection circuit 15 and causes the multiple-selected word lines to be in a floating state, and also connects the non-selected word line and the second row decoder circuit 13 by the second word line connection circuit 16 and fixes the non-selected word line to the non-selection potential (e.g., forming potential Vform). At timing t3, the column decoder 14 selects one bit line and sets the same to the forming potential. The non-volatile memory cells $M_{1,2}$, $M_{1,4}$, $M_{1,6}$, $M_{1,8}$ then can be multiple-selected and collectively formed.

In addition, at timing t4, the column decoder 14 sets the selected bit line to the non-selection potential (e.g., GND potential). At timing t5, the control circuit 11 connects the multiple-selected word lines and the first row decoder circuit 12 by the first word line connection circuit 15, and again sets the multiple-selected word lines to the selection potential (e.g., GND potential). A state in which the potential of the word line can be refreshed and the forming can be easily carried out is thus obtained. At timing t6, the control circuit 11 disconnects the multiple-selected word lines and the first row decoder circuit 12 by the first word line connection circuit 15 and causes the multiple-selected word lines to be in a floating state, and also connects the non-selected word line and the second row decoder circuit 13 by the second word line connection circuit 16 and fixes the non-selected word line to the non-selection potential (e.g., forming potential Vform). At timing t7, the column decoder 14 selects one bit line and sets the same to the forming potential. The forming of the bit in which the forming is not completed of the non-volatile memory cells $M_{1,2}$, $M_{1,4}$, $N_{1,6}$, $N_{1,8}$ then can be efficiently carried out.

It should be noted that, in the first embodiment, a case where the word line is multiple-selected alternately from a plurality of word lines in the memory cell array and forming has been described, but the word line may be multiple-selected for every two or more from a plurality of word lines and forming. When multiple-selected the word line for every two from the plurality of word lines and forming, this can be realized by adding one of each of a configuration corresponding to the first row decoder circuit 12 and the first word line connection circuit 15 in FIG. 1, and making a circuit change involved therewith on the configuration of FIG. 1. In this case, the forming operation is carried out mainly in three stages of the forming of the bit connected to the $k^{th}$ (k is a multiple of three) word line, the forming of the bit connected to the $k+1^{th}$ word line, and the forming of the bit connected to the $k+2^{th}$ word line.

In the first embodiment the potential of the non-selected word line adjacent to the multiple-selected word line is fixed from timing t2 illustrated in FIG. 3, but the potential of the non-selected word line may be fixed from timing t2 illustrated in FIG. 3. Among the non-selected word lines, the potential of that which is not adjacent to the multiple-selected word line may not be fixed.

In the first embodiment, a circuit for setting the potential to the even-numbered word line is arranged on one side of the memory cell array and a circuit for setting the potential to the odd-numbered word line is arranged on the other side, but a circuit for setting the potential of both the even-numbered word line and the odd-numbered word line may be arranged on either one of the sides of the memory cell array.

Furthermore, in the first embodiment, the application is limited to the forming of the memory cell array, but write can be carried out through a method similar to the above when using a variable resistor element in which the resistance value of the high resistance state high and the current flowing to the cell in write (set) is small (smaller than or equal to 100 nA).

Moreover, a case where the non-selection potential of the word line is equal to the forming potential Vform has been described in the first embodiment, but the non-selection potential of the word line may have a value which is shifted from the forming potential Vform with the difference between the non-selection potential of the word line and the forming potential Vform within a range of becoming smaller than the difference between the selection potential of the word line and the forming potential Vform.

Second Embodiment

A non-volatile semiconductor storage device according to a second embodiment will now be described.

All word lines of the memory cell array 10 are alternately set as the selected word line/non-selected word line in the first embodiment, but in the second embodiment, all word lines are divided into a plurality of block areas with a plurality of continuous word lines as a unit, one block area is sequentially selected, the selected word line/non-selected word line is alternately set within the selected block area, and the word lines of other block areas are all set as non-selected word lines.

Specifically, a plurality of word lines WL1 to WL24 in the memory cell array 10 include a plurality of blocks BA1 to BA4. When multiple-selecting and forming for every N lines, each of the plurality of blocks BA1 to BA4 includes M or more adjacent word lines assuming M is an integer of greater than or equal to N+2. For instance, when N=1, each block BA1 to BA3 has three or more word lines.

More specifically, the block BA1 has six adjacent word lines WL1 to WL6. The block BA2 has six adjacent word lines WL7 to WL12. The block BA3 has six adjacent word lines WL13 to WL18. The block BA4 has six adjacent word lines WL19 to WL24.

Figure 5:
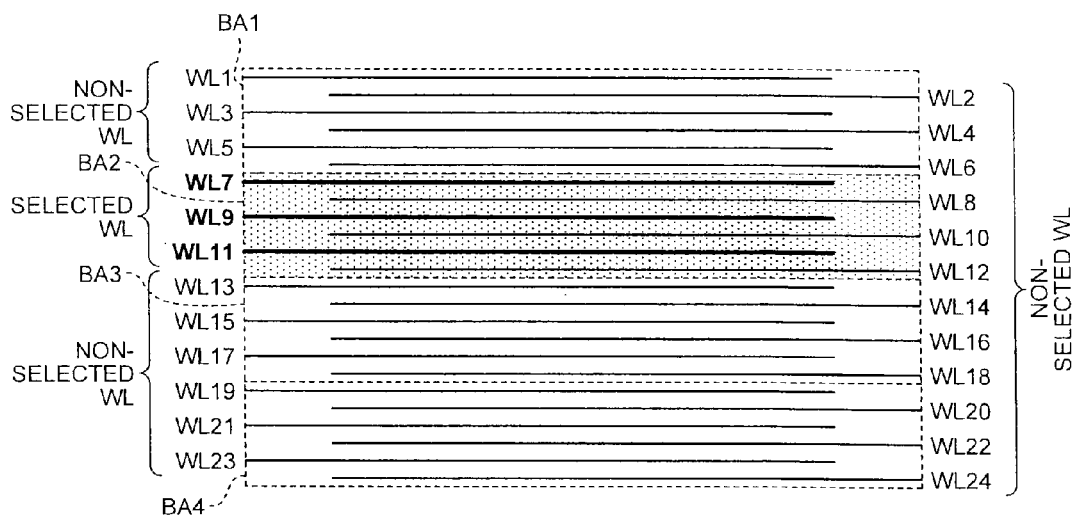
FIG. 5 is a view illustrating a forming operation according to a second embodiment.

The peripheral circuit 30 sequentially selects one block from the plurality of blocks BA1 to BA4, and carries out the forming operation similar to the first embodiment in the selected block. For instance, as illustrated in FIG. 5, the peripheral circuit 30 selects one block BA2 from the plurality of blocks BA1 to BA4, and carries out an operation of when a change of having the word lines to be multiple-selected as the word lines WL7, WL9, WL11 is added with respect to the operation of timing t1 to t7 illustrated in FIG. 3 in a period in which the block BA2 is selected. Subsequently, the peripheral circuit 30 carries out an operation of when a change of having the word lines to be multiple-selected as the word lines WL8, WL10, WL12 is added with respect to the operation of timing t1 to t7 illustrated in FIG. 3 in a period in which the block BA2 is selected.

Thus, according to the second embodiment, the number of word lines of when multiple-selecting and collectively forming can be limited, so that a plurality of non-volatile memory cells can be collectively formed while reducing the charging time of the multiple-selected word lines.

Figure 6:
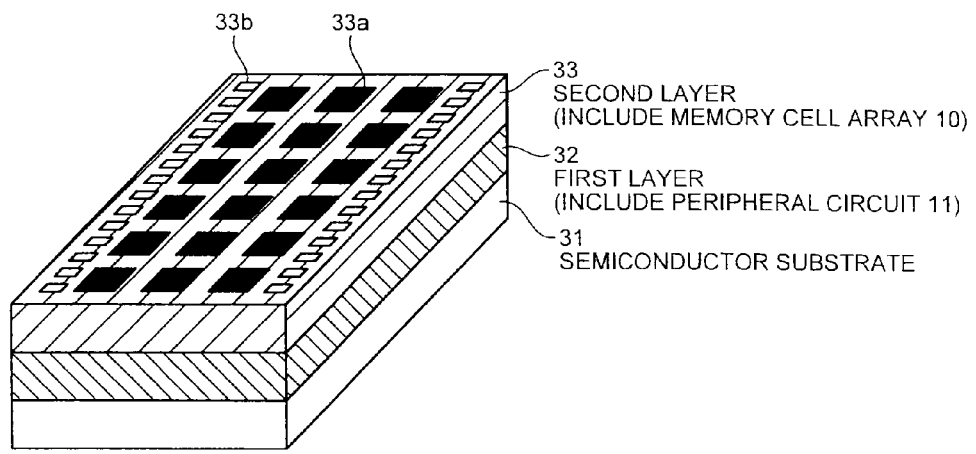
FIG. 6 is a schematic diagram illustrating a stacked structure of the non-volatile semiconductor storage device in the first embodiment and the second embodiment.

A stacked structure of the non-volatile semiconductor storage device according to the first embodiment and the second embodiment will now be described with reference to FIG. 6. FIG. 6 is a schematic diagram illustrating a stacked structure of the non-volatile semiconductor storage device.

As illustrated in FIG. 6, the non-volatile semiconductor storage device includes a first layer 32 and a second layer 33, which are stacked, on a semiconductor substrate (e.g., silicon substrate) 31. The first layer 32 includes a peripheral circuit 11 described above. The second layer 33 includes the memory cell array 10 described above. The first layer 32 and the second layer 33 are connected to each other by a through-hole.

The first layer 32 is formed at a pitch wider than the pitch of the word line WL and the bit line BL in the second layer 33 such as with the 90 nm design rule excluding the connecting portion with the second layer 33.

The second layer 33 includes a memory cell array area 33a and an input/output (I/O) area 33b. The memory cell array area 33a is a region arranged in a matrix form to configure the memory cell array 10. The size of the memory cell array area 33a is 22 μm×22 μm, where 512×512 memory cells M are formed in the area. The input/output area 33b includes a pad to be connected to a lead frame in an assembly step. The pad and the lead frame are connected with a bonding wire.

Figure 7:
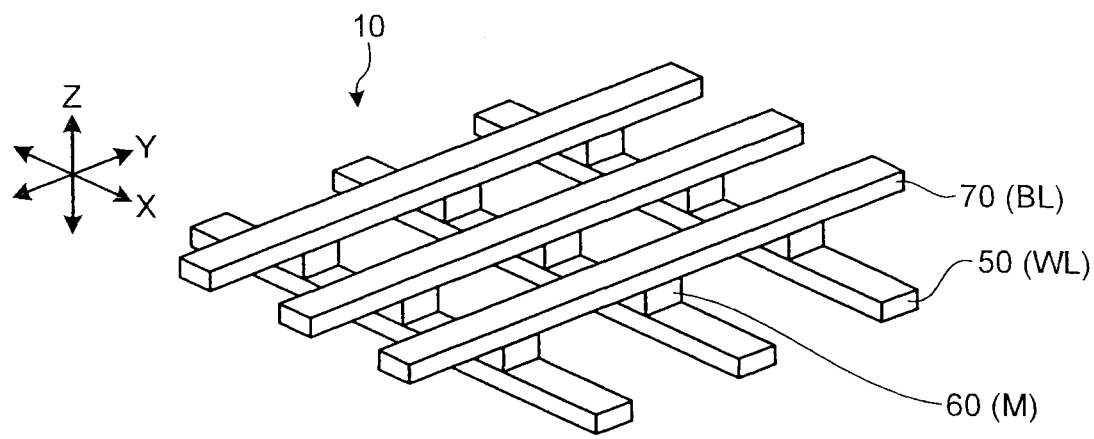
FIG. 7 is a view illustrating a configuration of the memory cell array in the first embodiment and the second embodiment.

The stacked structure of the memory cell array 10 in the second layer 33 will now be described with reference to FIG. 7. FIG. 7 is a perspective view illustrating the memory cell array 10. The memory cell array 10 is configured by a so-called cross point type.

As illustrated in FIG. 7, the memory cell array 10 includes a first conductive layer 50, a memory layer 60, and a second conductive layer 70 from the lower layer to the upper layer. The first conductive layer 50 functions as the word line WL. The memory layer 60 functions as the memory cell M. The second conductive layer 70 functions as the bit line BL.

As illustrated in FIG. 7, the first conductive layer 50 is formed to a stripe form extending in the X direction with a predetermined pitch in the Y direction. The first conductive layer 50 is made from metal. The first conductive layer 50 is desirably made from a material that has resistance to heat and that has low resistance value, and is made from tungsten (W), titanium (Ti), tantalum (Ta), and a nitride thereof, or a stacked structure thereof. Specifically, the first conductive layer 50 is configured at a pitch of 44 nm, that is, with a line having line width of 22 nm and a space of 22 nm.

As illustrated in FIG. 7, the memory layer 60 is arranged on the first conductive layer 50, and is arrayed in a matrix form in the X direction and the Y direction.

As illustrated in FIG. 7, the second conductive layer 70 is formed to a stripe form extending in the Y direction with a predetermined pitch in the X direction. The second conductive layer 70 is formed to contact the upper surface of the memory layer 60. The second conductive layer 70 is desirably made from a material that has resistance to heat and that has low resistance value, and is made from tungsten (W), titanium (Ti), tantalum (Ta), and a nitride thereof, or a stacked structure thereof. Specifically, the second conductive layer 70 is configured at a pitch of 44 nm, that is, with a line having line width of 22 nm and a space of 22 nm.

Figure 8:
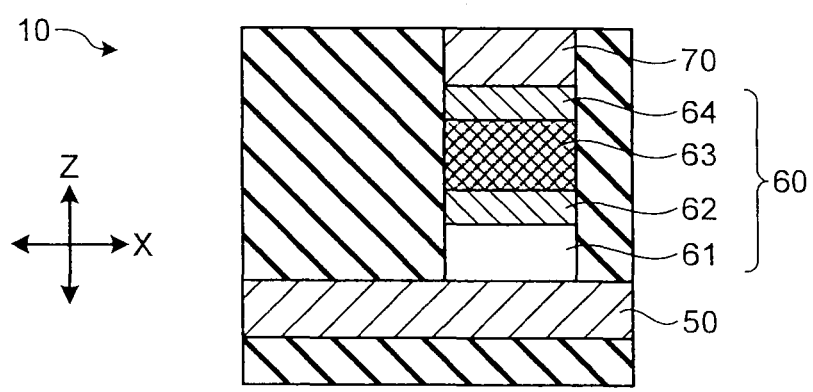
FIG. 8 is a view illustrating a cross-sectional configuration of the memory cell in the first embodiment and the second embodiment.

The stacked structure of the memory layer 60 will now be described in detail with reference to FIG. 8. FIG. 8 is a cross-sectional view of FIG. 7.

As illustrated in FIG. 8, the memory layer 60 includes a diode layer 61, a first electrode layer 62, a variable resistance layer 63, and a second electrode layer 64 from the lower layer to the upper layer.

The diode layer 61 is formed on the upper surface of the first conductive layer 50. The diode layer 61 functions as a diode D. The diode layer 61 may be a PN junction diode formed in the silicon substrate, but instead, a PN junction diode of SiGe alloy, a Schottky diode, or the like may be used.

The first electrode layer 62 is formed on the upper surface of the diode layer 61. The first electrode layer 62 is made from TiN or TaN. The first electrode layer 62 is made from $TiO_2$ doped with Pt, W, WN, Nb.

The variable resistance layer 63 is formed on the upper surface of the first electrode layer 62. The variable resistance layer 63 functions as the variable resistor element R1. The variable resistance layer 63 is made from a material selected from $Pr_{0.7}Ca_{0.3}MnO_3$, $SrTi_{1-x}Nb_xO_3$, $Sm_{0.7}Ca_{0.3}MnO_3$, $GdO_x$, $Fe_3O_4$, $\gamma\text{-}Fe_2O_3$, GeSe, $Cu_2S$.

The second electrode layer 64 is formed between the upper surface of the variable resistance layer 63 and the lower surface of the second conductive layer 70. The second electrode layer 64 is made from a material similar to the first electrode layer 62.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
    a plurality of first lines;
    a plurality of second lines that intersect the plurality of first lines;
    a plurality of non-volatile memory cells arranged at positions where the plurality of first lines and the plurality of second lines intersect; and
    a control unit that controls the plurality of non-volatile memory cells through the plurality of first lines and the plurality of second lines; wherein
    a variable resistor element and a rectifier element are connected in series in each of the plurality of non-volatile memory cells; and
    the control unit multiple-selects first lines for every N lines from the plurality of first lines, N being an integer greater than or equal to one, and sets the multiple-selected first lines to a selection potential, and fixes potentials of non-selected first lines at least adjacent to the multiple-selected first lines at a first timing, makes the multiple-selected first lines be in a floating state at a second timing after the first timing, and selects one second line from the plurality of second lines and sets the one second line to a forming potential at a third timing after the second timing,
    wherein at the first timing, among the plurality of first lines, the control unit collectively fixes potentials of the non-selected first lines adjacent to the multiple-selected first lines to the non-selection potential, and does not fix potentials of the non-selected first lines not adjacent to the multiple-selected first lines.

2. The non-volatile semiconductor storage device according to claim 1, wherein
    at the first timing, among the plurality of first lines, the control unit collectively sets the multiple-selected first lines to the selection potential, and collectively fixes potentials of the non-selected first lines at a non-selection potential.

3. The non-volatile semiconductor storage device according to claim 1, wherein
    the plurality of first lines is a plurality of word lines; and
    the plurality of second lines is a plurality of bit lines.

4. The non-volatile semiconductor storage device according to claim 1, wherein N is one.

5. The non-volatile semiconductor storage device according to claim 1, wherein
    the plurality of first lines includes a plurality of blocks;
    each of the plurality of blocks has M or more adjacent first lines, M being an integer greater than or equal to N+2;
    the control unit selects one block from the plurality of blocks; and
    a period in which one block is selected includes the first timing, the second timing, and the third timing.

6. The non-volatile semiconductor storage device according to claim 2, wherein
    at the first timing, among the plurality of first lines, the control unit collectively fixes potentials of all the non-selected first lines to the non-selection potential.

7. The non-volatile semiconductor storage device according to claim 2, wherein
    a difference between the non-selection potential and the forming potential is smaller than a difference between the selection potential and the forming potential.

8. The non-volatile semiconductor storage device according to claim 7, wherein
    the non-selection potential is equivalent to the forming potential; and
    the selection potential is equivalent to a ground potential.

9. The non-volatile semiconductor storage device according to claim 5, wherein
    the control unit sequentially selects one block from the plurality of blocks.

10. A non-volatile semiconductor storage device comprising:
    a plurality of first lines;
    a plurality of second lines that intersect the plurality of first lines;
    a plurality of non-volatile memory cells arranged at positions where the plurality of first lines and the plurality of second lines intersect; and
    a control unit that controls the plurality of non-volatile memory cells through the plurality of first lines and the plurality of second lines; wherein
    a variable resistor element and a rectifier element are connected in series in each of the plurality of non-volatile memory cells; and
    the control unit multiple-selects first lines for every N lines from the plurality of first lines, N being an integer greater than or equal to one, and sets the multiple-selected first lines to a selection potential, and fixes potentials of non-selected first lines at least adjacent to the multiple-selected first lines at a first timing, makes the multiple-selected first lines be in a floating state at a second timing after the first timing, and selects one second line from the plurality of second lines and sets the one second line to a forming potential at a third timing after the second timing,
    wherein the control unit includes:
    a first selection circuit that multiple-selects first lines from the plurality of first lines;
    a second selection circuit that selects a second line from the plurality of second lines;
    a connection circuit that connects the plurality of first lines to the first selection circuit; and
    a control circuit that controls the first selection circuit and the connection circuit;
    and wherein the control circuit connects the multiple-selected first lines and the first selection circuit through the connection circuit to set the multiple-selected first lines to the selection potential and connects the non-selected first lines to the first selection circuit through the connection circuit to fix the non-selected first lines to the non-selection potential at the first timing, and disconnects the multiple-selected first lines and the first selection circuit through the connection circuit to have the multiple-selected first line in a floating state at the second timing; and the second selection circuit selects the one second line and sets the one second line to the forming potential at the third timing.

11. The non-volatile semiconductor storage device according to claim 10, wherein
the control unit sets the one second line to a second non-selection potential at a fourth timing after the third timing, sets the multiple-selected first lines to the selection potential and fixes potentials of the non-selected first lines at least adjacent to the multiple-selected first lines at a fifth timing after the fourth timing, causes the multiple-selected first lines to be in a floating state at a sixth timing after the fifth timing, and selects one second line from the plurality of second lines and sets the one second line to the forming potential at a seventh timing after the sixth timing.

12. The non-volatile semiconductor storage device according to claim 11, wherein
the second selection circuit sets the one second line to the second non-selection potential at the fourth timing;
the control circuit again connects the multiple-selected first lines and the first selection circuit through the connection circuit to set the multiple-selected first lines to the selection potential and connects the non-selected first line and the first selection circuit through the connection circuit to fix the non-selected first line to the non-selection potential at the fifth timing, and disconnects the multiple-selected first lines and the first selection circuit through the connection circuit to have the multiple-selected first lines in a floating state at the sixth timing; and
the second selection circuit selects the one second line and sets the one second line to a forming potential the seventh timing.

13. The non-volatile semiconductor storage device according to claim 10, wherein
at the first timing, among the plurality of first lines, the control unit collectively sets the multiple-selected first lines to the selection potential, and collectively fixes potentials of the non-selected first lines at a non-selection potential.

14. The non-volatile semiconductor storage device according to claim 10, wherein
at the first timing, among the plurality of first lines, the control unit collectively fixes potentials of the non-selected first lines adjacent to the multiple-selected first lines to the non-selection potential, and does not fix potentials of the non-selected first lines not adjacent to the multiple-selected first lines.

15. The non-volatile semiconductor storage device according to claim 10, wherein
the plurality of first lines is a plurality of word lines; and
the plurality of second lines is a plurality of bit lines.

16. The non-volatile semiconductor storage device according to claim 10, wherein N is one.

17. The non-volatile semiconductor storage device according to claim 12, wherein
the control circuit carries out a verify operation of whether or not a forming of a non-volatile memory cell corresponding to the multiple-selected first lines is completed in a period from the fifth timing to the sixth timing.

18. The non-volatile semiconductor storage device according to claim 12, wherein
the control unit carries out a verify operation of whether or not a forming of a non-volatile memory cell corresponding to the multiple-selected first lines is completed at an eighth timing after the seventh timing.

19. The non-volatile semiconductor storage device according to claim 18, wherein
the control unit multiple-selects, after the forming is completed on all the non-volatile memory cells corresponding to the multiple-selected first lines, a first line for every N lines from the non-selected first lines of the plurality of first lines and sets the multiple-selected first lines to the selection potential.

20. The non-volatile semiconductor storage device according to claim 13, wherein
at the first timing, among the plurality of first lines, the control unit collectively fixes potentials of all the non-selected first lines to the non-selection potential.

21. The non-volatile semiconductor storage device according to claim 13, wherein
a difference between the non-selection potential and the forming potential is smaller than a difference between the selection potential and the forming potential.

22. The non-volatile semiconductor storage device according to claim 21, wherein
the non-selection potential is equivalent to the forming potential; and
the selection potential is equivalent to a ground potential.

23. A non-volatile semiconductor storage device comprising:
a plurality of first lines;
a plurality of second lines that intersect the plurality of first lines;
a plurality of non-volatile memory cells arranged at positions where the plurality of first lines and the plurality of second lines intersect; and
a control unit that controls the plurality of non-volatile memory cells through the plurality of first lines and the plurality of second lines; wherein
a variable resistor element and a rectifier element are connected in series in each of the plurality of non-volatile memory cells; and
the control unit multiple-selects first lines for every N lines from the plurality of first lines, N being an integer greater than or equal to one, and sets the multiple-selected first lines to a selection potential, and fixes potentials of non-selected first lines at least adjacent to the multiple-selected first lines at a first timing, makes the multiple-selected first lines be in a floating state at a second timing after the first timing, and selects one second line from the plurality of second lines and sets the one second line to a forming potential at a third timing after the second timing,
wherein the control unit sets the one second line to a second non-selection potential at a fourth timing after the third timing, sets the multiple-selected first lines to the selection potential and fixes potentials of the non-selected first lines at least adjacent to the multiple-selected first lines at a fifth timing after the fourth timing, causes the multiple-selected first lines to be in a floating state at a sixth timing after the fifth timing, and selects one second line from the plurality of second lines and sets the one second line to the forming potential at a seventh timing after the sixth timing.

24. The non-volatile semiconductor storage device according to claim 23, wherein
at the first timing, among the plurality of first lines, the control unit collectively sets the multiple-selected first lines to the selection potential, and collectively fixes potentials of the non-selected first lines at a non-selection potential.

25. The non-volatile semiconductor storage device according to claim 23, wherein
at the first timing, among the plurality of first lines, the control unit collectively fixes potentials of the non-selected first lines adjacent to the multiple-selected first lines to the non-selection potential, and does not fix potentials of the non-selected first lines not adjacent to the multiple-selected first lines.

26. The non-volatile semiconductor storage device according to claim 23, wherein
the plurality of first lines is a plurality of word lines; and
the plurality of second lines is a plurality of bit lines.

27. The non-volatile semiconductor storage device according to claim 23, wherein N is one.

28. The non-volatile semiconductor storage device according to claim 24, wherein
at the first timing, among the plurality of first lines, the control unit collectively fixes potentials of all the non-selected first lines to the non-selection potential.

29. The non-volatile semiconductor storage device according to claim 24, wherein
a difference between the non-selection potential and the forming potential is smaller than a difference between the selection potential and the forming potential.

30. The non-volatile semiconductor storage device according to claim 29, wherein
the non-selection potential is equivalent to the forming potential; and
the selection potential is equivalent to a ground potential.

31. A forming method of a non-volatile memory cell in a non-volatile semiconductor device including a plurality of first lines, a plurality of second lines, a plurality of non-volatile memory cells, and a control unit, the plurality of second lines intersecting the plurality of first lines, the plurality of non-volatile memory cells being arranged at positions where the plurality of first lines and the plurality of second lines intersect, each of the plurality of non-volatile memory cells having a configuration in which a variable resistor element and a rectifier element are connected in series, the control unit controlling the plurality of non-volatile memory cells through the plurality of first lines and the plurality of second lines; the method comprising:
multiple-selecting a first line for every N lines from the plurality of first lines, N being an integer greater than or equal to one, and setting the multiple-selected first lines to a selection potential, and fixing potentials of non-selected first lines at least adjacent to the multiple-selected first line;
making the multiple-selected first lines be in a floating state after the setting to the selection potential;
selecting one second line from the plurality of second lines and setting the one second line to a forming potential after the fixing of the potential of the first line;
setting the one second line to a second non-selection potential after the setting to the forming potential;
again setting the multiple-selected first lines to the selection potential and again fixing potentials of the non-selected first lines at least adjacent to the multiple-selected first lines after the setting to the second non-selection potential;
making the multiple-selected first lines be in a floating state after again setting to the selection potential; and
selecting one second line from the plurality of second lines and again setting the one second line to a forming potential after again fixing the potential of the first line.

32. The forming method according to claim 31, further comprising
performing a verify operation on whether or not forming of the non-volatile memory cell corresponding to the multiple-selected first lines is completed, after the again setting to the forming potential.

33. A non-volatile semiconductor storage device comprising:
a plurality of first lines;
a plurality of second lines that intersect the plurality of first lines;
a plurality of non-volatile memory cells arranged at positions where the plurality of first lines and the plurality of second lines intersect; and
a control unit that controls the plurality of non-volatile memory cells through the plurality of first lines and the plurality of second lines; wherein
a variable resistor element and a rectifier element are connected in series in each of the plurality of non-volatile memory cells; and
the control unit multiple-selects first lines for every N lines from the plurality of first lines, N being an integer greater than or equal to one, and sets the multiple-selected first lines to a selection potential, and fixes potentials of non-selected first lines at least adjacent to the multiple-selected first lines at a first timing, makes the multiple-selected first lines be in a floating state at a second timing after the first timing, and selects one second line from the plurality of second lines and sets the one second line to a forming potential at a third timing after the second timing, wherein
the plurality of first lines includes a plurality of blocks;
each of the plurality of blocks has M or more adjacent first lines, M being an integer greater than or equal to N+2;
the control unit selects one block from the plurality of blocks; and
a period in which one block is selected includes the first timing, the second timing, and the third timing.

34. The non-volatile semiconductor storage device according to claim 33, wherein
the control unit sequentially selects one block from the plurality of blocks.

* * * * *